(12) United States Patent
Manninen et al.

(10) Patent No.: US 9,528,763 B2
(45) Date of Patent: Dec. 27, 2016

(54) ARRANGEMENT FOR REMOVING WATER FROM AN EQUIPMENT SPACE

(71) Applicant: ABB Oy, Helsinki (FI)

(72) Inventors: Jorma Manninen, Vantaa (FI); Timo Koivuluoma, Vantaa (FI)

(73) Assignee: ABB Technology Oy, Helsinki (FI)

( * ) Notice: Subject to any disclaimer, the term of this patent is extended or adjusted under 35 U.S.C. 154(b) by 442 days.

(21) Appl. No.: 14/068,665

(22) Filed: Oct. 31, 2013

(65) Prior Publication Data

US 2014/0115918 A1     May 1, 2014

(30) Foreign Application Priority Data

Oct. 31, 2012  (EP) ..................................... 12190734

(51) Int. Cl.
*F26B 19/00*  (2006.01)
*F26B 21/06*  (2006.01)
(Continued)

(52) U.S. Cl.
CPC ............. *F26B 25/08* (2013.01); *F26B 21/086* (2013.01); *H05K 5/0213* (2013.01)

(58) Field of Classification Search
CPC ................ B65D 81/26; B65D 81/261–81/265; B65D 51/30; F26B 25/08; F26B 21/086; H05K 5/0213; B01D 46/0031; B01D 5/00; B01D 5/0072; B01D 5/0078; B01D 19/00; B01D 19/0021; B01D 19/0031; B01D 19/0042; B01D 19/0068
(Continued)

(56) References Cited

U.S. PATENT DOCUMENTS 4,594,082 A  *  6/1986  Catherwood, Sr. .. B01D 53/261
                                                        55/318
5,884,486 A     3/1999  Hughes et al.
(Continued)

FOREIGN PATENT DOCUMENTS

CN     2725762 Y      9/2005
CN     1712814 A     12/2005
(Continued)

OTHER PUBLICATIONS

Office Action/Search Report issued on Apr. 3, 2015, by the Chinese Patent Office in corresponding Chinese Patent Application No. 201310524687.4 and an English translation of Office Action/Search Report. (16 pages).

(Continued)

*Primary Examiner* — Kenneth Rinehart
*Assistant Examiner* — John McCormack
(74) *Attorney, Agent, or Firm* — Taft Stettinius & Hollister LLP

(57) ABSTRACT

Exemplary embodiments are directed to an equipment space that is a closed space provided with electrical equipment and an air dryer condensing the moisture of the air in the equipment space into water. A system for removing water from the equipment space includes a porous element having a capillary structure and being located in an outlet opening of the equipment space. The porous element is connected such that water condensed by the air dryer is directed to a first inner surface of the porous element. The capillary structure of the porous element is configured to propogate water from the inner surface of the porous element to an outer surface of the porous element. The outer surface of the porous element is configured to release water to ambient air outside the equipment space.

13 Claims, 4 Drawing Sheets

(51) Int. Cl.
*F26B 25/08* (2006.01)
*F26B 21/08* (2006.01)
*H05K 5/02* (2006.01)

(58) Field of Classification Search
USPC .......... 34/95, 85, 468, 73, 75, 80, 472, 473;
55/423; 96/108, 154, 155, 202, 219, 134,
96/148; 95/223, 241
See application file for complete search history.

(56) References Cited

U.S. PATENT DOCUMENTS

| 6,274,054 | B1 * | 8/2001 | Murphy, Jr. ............ C02F 1/505 |
| | | | 210/167.11 |
| 8,551,230 | B2 * | 10/2013 | Caggiano ............ B01D 53/002 |
| | | | 95/113 |
| 2011/0030388 | A1 | 2/2011 | Johansson et al. |
| 2014/0053723 | A1 | 2/2014 | Carollo et al. |

FOREIGN PATENT DOCUMENTS

| CN | 101506590 A | 8/2009 |
| CN | 101820972 A | 9/2010 |
| DE | 20 13 974 A1 | 12/1971 |
| EP | 54-150774 A | 11/1979 |
| EP | 2 514 511 A1 | 10/2012 |
| JP | 2008-155134 A | 7/2008 |
| WO | 2008/025377 A1 | 3/2008 |

OTHER PUBLICATIONS

European Search Report dated Apr. 5, 2013.

\* cited by examiner

ARRANGEMENT FOR REMOVING WATER FROM AN EQUIPMENT SPACE

RELATED APPLICATION(S)

This application claims priority under 35 U.S.C. §119 to European Application 12190734.9 filed in Europe on Oct. 31, 2012. The content of which is incorporated by reference in its entirety.

FIELD

The present disclosure relates to an arrangement for removing water from an equipment space.

BACKGROUND INFORMATION

There are different kinds of known equipment spaces either situated outdoors or indoors. An equipment space is a closed space restricted by walls and can include (e.g., comprise) a door in order to allow entrance into the equipment space. The equipment space can be for example, a room, a container, a cabinet or a casing including different kinds of electric equipment for example, frequency converters or motor drives. Environmental factors and the use of the electric equipment in the equipment space can result in a high humidity in the air in the equipment space and the air humidity can condensate into water. The air humidity in equipment spaces can be managed in different active ways for example, by air dryers, which condensate the humidity in the air into water. The air dryers can, depending on the environmental factors, condensate many decilitres of water from the air per day. This water has to be removed from the equipment space in a reliable manner.

The equipment space can include a water container into which the water from the air dryer is lead. The water container can then be emptied manually in accordance with a certain service program. It is also possible that the water is lead from the water container or directly from the air dryer out of the equipment space with a hose through an opening in a wall of the equipment space. The opening could be arranged in the floor of the equipment space. Condense water would then be collected by the floor and led through said opening in the floor out from the equipment space.

There are, however, problems such as in equipment spaces positioned outdoors when water is lead out of the equipment space with a hose or through an outlet opening in a wall of the equipment space. There is a risk that moulds and/or funguses will begin to grow in the outlet of the hose or in the outlet opening in the wall. There is also a risk that insects will penetrate into the equipment space and accumulate in the outlet opening. Based on the above, the skilled artisan would recognize that the water removal route should be properly maintained, which can include testing at regular intervals and cleaning when appropriate.

There is thus a need for an arrangement for removing water from an equipment space where the above mentioned problems have been eliminated.

SUMMARY

An exemplary arrangement for removing water from an equipment space is disclosed, said equipment space being a closed space provided with electrical equipment and an air dryer condensing the moisture of the air in the equipment space into water, the arrangement comprising: a porous element having a capillary structure and being located in an outlet opening of said equipment space, whereby water condensed by the air dryer is directed to a first inner surface of the porous element, said water propagating in the capillary structure of the porous element from the first inner surface of the porous element to a second outer surface of the porous element from which second outer surface of the porous element the water is released to ambient air outside the equipment space.

An exemplary system for removing water from an equipment space configured as a closed space having electrical equipment and an air dryer to condense the moisture of air in the equipment space into water is disclosed, the system comprising: a porous element having a capillary structure and being located in an outlet opening of said equipment space, wherein the porous element is connected to receive water from the air dryer along an inner surface, said capillary structure of the porous element is configured to propogate water from the inner surface to an outer surface, and the outer surface is configured to release the water to ambient air outside the equipment space.

An exemplary method for removing water from an equipment space configured as a closed space is disclosed, the equipment space having electrical equipment, an air dryer to condense the moisture of air in the equipment space into water, and a porous element having a capillary structure and being located in an outlet opening of said equipment space, the method comprising: directing water condensed by the air dryer to an inner surface of the porous element; propagating said water in the capillary structure of the porous element from the inner surface of the porous element to an outer surface of the porous element; and releasing water from the outer surface of the porous element to ambient air outside the equipment space.

BRIEF DESCRIPTION OF THE DRAWINGS

In the following the disclosure will be described in greater detail by means of exemplary embodiments with reference to the attached drawings, in which.

DETAILED DESCRIPTION

Exemplary embodiments of the present disclosure provide a simple, reliable and maintenance free arrangement for removing water from an equipment space.

The equipment space is a closed space provided with electrical equipment and an air dryer condensing the moisture of the air in the equipment space into water. The arrangement for removing water from the equipment space includes a porous element having a capillary structure and being situated in an outlet opening of said equipment space. Water condensed by the air dryer is directed to a first inner surface of the porous element, said water propagating in the capillary structure of the porous element from the first inner surface of the porous element to a second outer surface of the porous element from which second outer surface of the porous element the water is released to the ambient air outside the equipment space.

The growth of moulds and funguses on the porous element can be eliminated by making the porous element of a bacteriostatic material, e.g., a material resisting the growth of moulds and sponges. Suitable bacteriostatic materials can include for example, copper or its alloys, cobalt and nickel. If the porous element is made of a material, which is not as such bacteriostatic, then the water leading route to the porous element could be made of a bacteriostatic material for example, copper. If neither the water leading route nor the porous element, are bacteriostatic, then one could insert for example, a copper piece in the water leading route in order to turn the water into bacteriostatic.

The material of the porous element could further be selected so that it withstands climatic circumstances and wearing caused by for example, ants and termites. The porous element could be made of a material in granulate format. A solid porous structure can be made for example, by sintering the granulates of the material so that the granulates become attached to each other. There will thus remain passages, e.g., a capillary structure between the granulates. A corresponding porous structure is also achieved with metal foams.

The porous element will also eliminate the risk that detrimental amounts of insects or dust could penetrate into the equipment space through the water removal route and accumulate in the water removal route. The need for maintenance of the water removal route is thus eliminated with the porous element.

The capillary structure of the porous element could be made such that detrimental amounts of dust or ambient air cannot penetrate into the equipment space through the porous element. The protection could be made such that a high level of protection for example, IP 55 or more is achieved. The thickness of the porous element from the first inner surface to the second outer surface and the size of the granulates, which determine the size of the capillaries will determine the degree of protection that can be achieved with the porous element.

Figure 1:
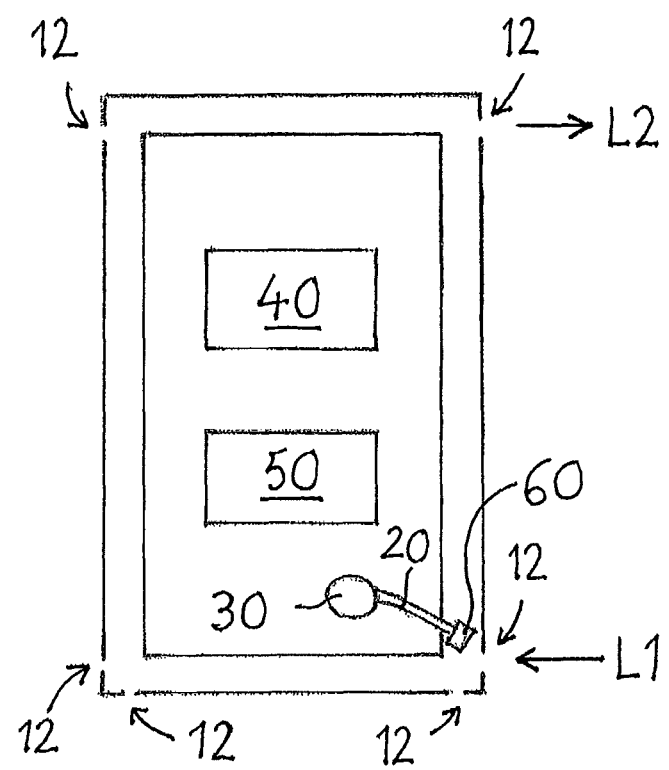
FIG. 1 shows an equipment space with an arrangement for removing water from the equipment space according to an exemplary embodiment of the disclosure.

FIG. 1 shows an equipment space with an arrangement for removing water from the equipment space according to an exemplary embodiment of the disclosure. The equipment space 10 includes an inner shell 11a and an outer shell 11b. The inner shell 11a forms a closed space within it and the outer shell 11b includes ventilation openings 12. This means that the space 11c between the inner shell 11a and the outer shell 11b can be ventilated by air L1 flowing into the space 11c through one or several inlet ventilation openings 12. The air L1 flowing into the space 11c will flow out L2 of the space through one or several outlet ventilation openings 12. The ventilation of said space 11c can be done freely or with the aid of a fan. The equipment space 10 includes electrical equipment 40, 50 for example, electric motor control apparatuses like frequency converters or other suitable electric motor control devices as desired. The equipment space 10 includes further an air dryer 30 condensing the moisture in the air of the equipment space 10 into water. The air dryer 30 can be any known air dryer. The water condensed by the air dryer 30 is lead with a water directing means 20 from the interior of the equipment space 10 through the inner shell 11a into the space 11c between the inner shell 11a and the outer shell 11b. In an exemplary embodiment, the water directing means 20 is a hose or pipe having an outlet opening 70 situated in the ambient air outside the outer shell 11b of the equipment space 10. The outlet opening 70 of the hose or pipe 20 can be provided with a porous element 60 having a capillary structure. The hose or pipe 20 forms a connection from the interior of the closed equipment space 10 to the ambient air outside the equipment space 10 through the outlet opening 70.

Figure 2:
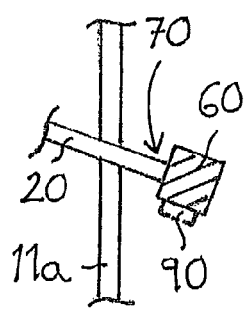
FIG. 2 shows a first arrangement of the equipment space according to an exemplary embodiment of the disclosure.

FIG. 2 shows a first arrangement of the equipment space according to an exemplary embodiment of the disclosure. In another exemplary embodiment, the water directing means 20 can include a hose or a pipe with a circular cross-section. The hose or pipe 20 is impervious to water. The outlet opening 70 of the hose or pipe 20 opens into the porous element 60. Water flowing in the hose or pipe 20 enters from the outlet opening 70 of the hose or pipe 20 to a first inner surface of the porous element 60 and propagates in the capillary structure of the porous element 60 towards a second outer surface of the porous element 60. The water movement in the porous element 60 is based on adhesion forces between the water and the solid inner walls of the capillary structure. The water can then be released from the second outer surface of the porous element 60 to the ambient air. The water can either evaporate from the second outer surface of the porous element 60 to the ambient air and/or drop down as water from the porous element 60. The first inner surface of the porous element 60 can include the surface facing the outlet opening 70 of the hose or pipe 20. The second outer surface of the porous element 60 can include the surface of the porous element 60 that is in contact with the ambient air outside the equipment space 10.

The porous element 60 can also include a heating element 90. The heating of the porous element 60 with a heating element 90 can intensify the evaporation of water from the outer surface of the porous element 90 to the ambient air. The heating element 90 can also help to keep the porous element 60 and the outer end portion of the hose or pipe 20 clean from moulds and insects.

The porous element 60 can be made of a material forming a solid porous structure. The solid porous structure can be formed of a material in granulate format. The granulates can be attached to each other for example, by sintering. There will thus remain passages e.g., a capillary structure between the granulates.

Figure 3:
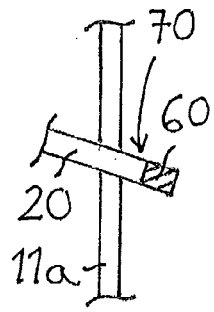
FIG. 3 shows a second arrangement of the equipment space according to an exemplary embodiment of the disclosure.

FIG. 3 shows a second arrangement of the equipment space according to an exemplary embodiment of the disclosure. As shown in FIG. 3, the porous element 60 is can be disposed at the outlet opening 70 of the hose or pipe 20 within the outer end portion of the hose or pipe 20. Water flowing in the hose or pipe 20 enters from the outlet opening 70 in the hose or pipe 20 into a first inner surface of the porous element 60 and propagates in the capillary structure of the porous element 60 towards a second outer surface of the porous element 60. The water can then evaporate from the outer surface of the porous element 60 to the ambient air and/or drop down as water from the outer surface of the porous element 60. The first inner surface of the porous element 60 is can be the first end surface of the porous element 60 within the hose or pipe 20. The second outer surface of the porous element 60 can be the second end surface of the porous element 60 that is in contact with the ambient air outside the equipment space 10.

Figure 4:
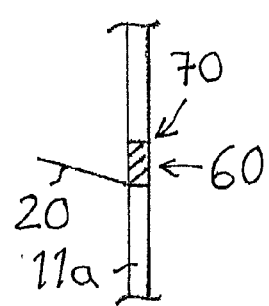
FIG. 4 shows a third arrangement of the equipment space according to an exemplary embodiment of the disclosure.

FIG. 4 shows a third arrangement of the equipment space according to an exemplary embodiment of the disclosure. As shown in FIG. 4, the porous element 60 can be disposed in an outlet opening 70 in the side wall 11a of the equipment space 10. The water directing means 20 can be an inclined surface ending at the lower surface of the outlet opening 70. In another exemplary embodiment, the water directing means 20 can be an inclined surface such as a horizontal surface. Water flowing along or accumulated on the water directing means 20 enters into the porous element 60 from a first inner surface of the porous element 60 and propagates in the capillary structure in the porous element 60 towards a second outer surface of the porous element 60. The water can then evaporate from the second outer surface of the porous element 60 to the ambient air and/or drop down as water from the outer end surface of the porous element 60. The cross section of the outlet opening 70 and thus also the porous element 60 can be rectangular or polygonal or circular. As shown in FIG. 4, the first inner surface of the porous element 60 can be the first end surface of the porous element 60 being situated inside the side wall 11a of the equipment space 10. The second outer surface of the porous element 60 can be the second end surface of the porous element 60 situated outside the side wall 11a of the equipment space 10. The second end surface of the porous element 60 can be in contact with the ambient air outside the equipment space 10. The thickness of the porous element 60 in the outlet opening 70 can naturally vary so that the thickness of the porous element 60 is equal to or thinner or thicker than the thickness of the side wall 11a. The thickness of the porous element 60 can be adjusted so that a desired IP-class is achieved.

Figure 5:
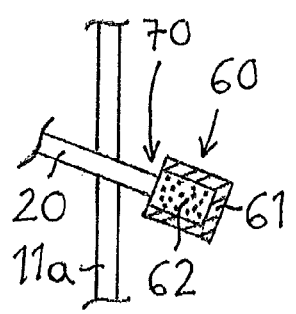
FIG. 5 shows a fourth arrangement of the equipment space according to an exemplary embodiment of the disclosure.

FIG. 5 shows a fourth arrangement of the equipment space according to an exemplary embodiment of the disclosure. This embodiment corresponds to that in FIG. 2 except for the construction of the porous element 60. As shown in FIG. 5, the porous element 60 includes an outer surface layer 61 being made of a solid porous material formed of granulates. The granulates are attached to each other in a fixed position so that there remains passages e.g., a capillary structure between the granulates. The outer surface layer 61 forms a support structure for the porous element 60. The inner part 62 of the porous element 60 is made of a loose porous material formed of granulates. The granulates are not attached to each other in this loose porous material. The porous element 60 could include an end plate through which the porous element 60 is attached for example, with threads on the end of the pipe 20.

Figure 6:
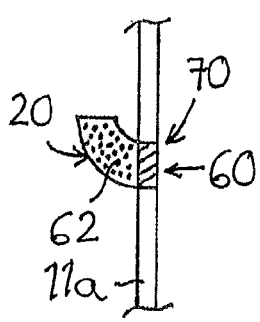
FIG. 6 shows a fifth arrangement of the equipment space according to an exemplary embodiment of the disclosure.

FIG. 6 shows a fifth arrangement of the equipment space according to an exemplary embodiment of the disclosure. This embodiment corresponds to that shown in FIG. 4 expect for the water directing means 20. As shown in FIG. 6, the water directing means 20 includes a curved channel directing the water to the first inner surface of the porous element 60. The curved channel 20 can be filled with a loose porous material 62 formed of granulates. The granulates are not attached to each other in this loose porous material. The water passes thus through this loose porous material 62 before entering the first inner surface of the porous element 60. The granulate layer 62 can form a more dense layer preventing in an effective way dust and air from entering into the equipment space 10 through the water removal route.

Figure 7:
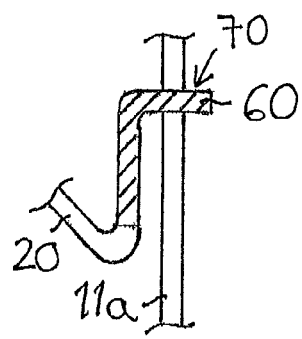
FIG. 7 shows a sixth arrangement of the equipment space according to an exemplary embodiment of the disclosure.

FIG. 7 shows a sixth arrangement of the equipment space according to an exemplary embodiment of the disclosure. As shown in FIG. 7, the porous element 60 is situated at the outlet opening 70 of the hose or pipe 20 within the outer end portion of the hose or pipe 20. The outer end portion of the hose or pipe 20 can have a horizontal portion preceded by a vertical portion. The vertical portion is preceded by an inclined portion. The porous element 60 can be within the horizontal and the vertical portion of the outer end portion of the hose or pipe 20. Water flowing along the inclined hose or pipe 20 enters into a first inner surface of the porous element 60 and propagates in the capillary structure of the porous element 60 towards a second outer surface of the porous element 60. The water will thus propagate against the force of gravity in the porous element 60 in the vertical portion of the outer end portion of the hose or pipe 20. This is possible due to the capillary structure of the porous element 60. The water can then evaporate from the second outer end surface of the porous element 60 to the ambient air and/or drop down as water from the outer end surface of the porous element 60. The porous element 60 is rather long in this embodiment. A longer porous element 60 can be more effective in preventing dust and air from penetrating into the equipment space 10 through the water removal route compared to a short porous element 60.

Figure 8:
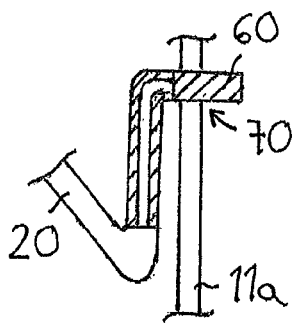
FIG. 8 shows a seventh arrangement of the equipment space according to an exemplary embodiment of the disclosure.

FIG. 8 shows a seventh arrangement of the equipment space according to an exemplary embodiment of the disclosure. This embodiment corresponds to that in FIG. 7 except for the inner portion of the porous element 60. As shown in FIG. 8, the inner portion of the porous element 60 situated in the vertical portion of the hose or pipe 20 is in this embodiment a hollow porous construction. The water can propagate in the capillary structure being situated on the inner surface of the hose or pipe 20. This embodiment will not be as effective in preventing dust and air from penetrating into the equipment space 10 through the water removal route as the embodiment shown in FIG. 7.

Figure 9:
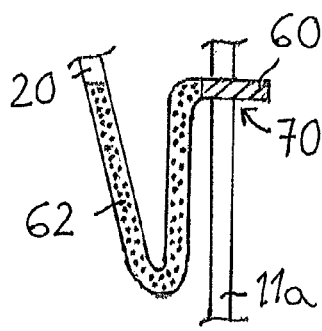
FIG. 9 shows an eighth arrangement of the equipment space according to an exemplary embodiment of the disclosure.

FIG. 9 shows an eighth arrangement of the equipment space according to an exemplary embodiment of the disclosure. This embodiment corresponds to that shown in FIG. 7 except for the part preceding the porous element 60. As shown in FIG. 9, the hose or pipe 20 forms a U-turn before entering into the outlet opening 70 in the side wall 11a of the equipment space 10. The U-turn of the hose or pipe 20 is filled with a loose porous material 62 formed of granulates, which are not attached to each other. The water can thus pass through this layer of loose porous material 62 formed of granulates before entering into the first inner surface of the porous element 60. This layer of loose porous material 62 formed of granulates can effectively eliminate any dust or air from the outside of entering through the hose or pipe 20 into the equipment space 10. The loose porous material 62 formed of granulates in the U-turn can remain wet even for long periods when no water enters into the hose or pipe 20. This could be the situation for example, when the equipment space 10 is positioned in a desert like environment. The humidity in the air in the equipment space will be very low during the day when the sun burns, which means that no water will be condensed by the dryer 30 during the day. Such an arrangement would make it possible to achieve a very high degree of protection against environmental conditions within the equipment space 10. A protection reaching over IP 55 could easily be achieved with such an arrangement.

Figure 10:
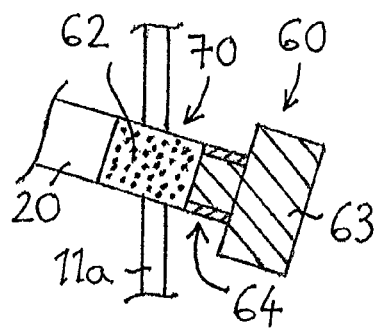
FIG. 10 shows a ninth arrangement of the equipment space according to an exemplary embodiment of the disclosure.

FIG. 10 shows a ninth arrangement of the equipment space according to an exemplary embodiment of the disclosure. This embodiment corresponds to that in FIG. 2 except for the construction of the porous element 60. As shown, in FIG. 10, the porous element 60 can include a solid end piece 63 being threaded 64 on the outer end surface or in the inner end surface of the pipe 20 leading water from the air dryer 30. A porous material layer 62 formed of granulates in loose format is positioned before the end piece 63 in the pipe 20. Water flows from the outlet opening 70 in the pipe 20 to a first inner surface of the porous element 60 and propagates through the porous material layer 62 and further through the threads 64 between the pipe 20 and the solid end piece 63 to a second outer surface of the porous element 60. The water can then evaporate from the second outer surface of the porous element 60 to the ambient air and/or drop down as water from the outer end surface of the porous element 60. The first inner surface of the porous element 60 is constituted by the inner surface of the porous material layer 62. The second outer surface of the porous element 60 is constituted by the outer surface of the end piece 63 that is in contact with the ambient air. The loose porous material layer 62 and the threads form a capillary structure in the porous element 60. The propagation of water through the porous element 60 would be rather slow in this embodiment. This embodiment could thus be used in applications where there is a need to remove only small amounts of water from the equipment space 10.

Figure 11:
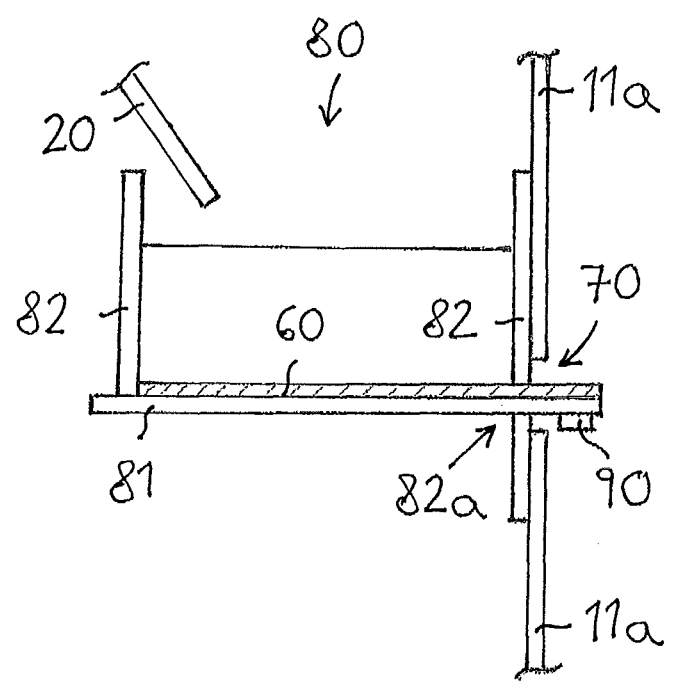
FIG. 11 shows a tenth arrangement of the equipment space according to an exemplary embodiment of the disclosure.

FIG. 11 shows a tenth arrangement of the equipment space according to an exemplary embodiment of the disclosure. This embodiment includes a water container 80 for the water condensed by the air dryer 30. The water condensed by the air dryer 30 is directed to the container 80 with a water directing means 20, which could be a hose or a pipe or an inclined surface. The water container 80 includes a bottom 81 and side walls 82. There is a porous element 60 on the bottom 81 of the water container 80. The bottom 81 of the water container 80 and the porous element 60 extend outside the water container 80 through an opening 82a in a side wall 82 of the water container 80. The side wall 82 of the water container 80 is positioned against the inner side wall 11a of the equipment space 10. The bottom 81 of the water container 80 and the porous element 60 further extend outside the inner side wall 11a of the equipment space 10 through an outlet opening 70 in said inner side wall 11a of the equipment space 10. The part of the bottom 81 and the porous element 60, which extend outside the inner side wall 11a form an outer portion of the bottom 81 and the porous element 60.

The bottom 81 and the side walls 82 of the water container 80 are impervious to water. Water will thus penetrate into the porous element 60 from a first inner surface of the porous element 60 within the water container 80. The water that penetrates into the porous element 60 will then propagate in the capillary structure in the porous element 60 towards the outer portion of the porous element 60. When the water propagating in the porous element 60 reaches the outer portion of the porous element 60, evaporation of water through a second outer open surface of the porous element 60 into the ambient air will take place and/or water will drop down from the outer end of the porous element 60.

The outer portion of the bottom 81 of the water container 80 can also be provided with a heating element 90 positioned on the lower surface of the outer portion of the bottom 81 of the water container 80. The heating element 90 will intensify the evaporation of water from the second outer open surface of the porous element 60 to the ambient air. The heating element 90 will also help to keep the outer part of the bottom 81 with the porous element 60 clean from moulds and insects.

Figure 12:
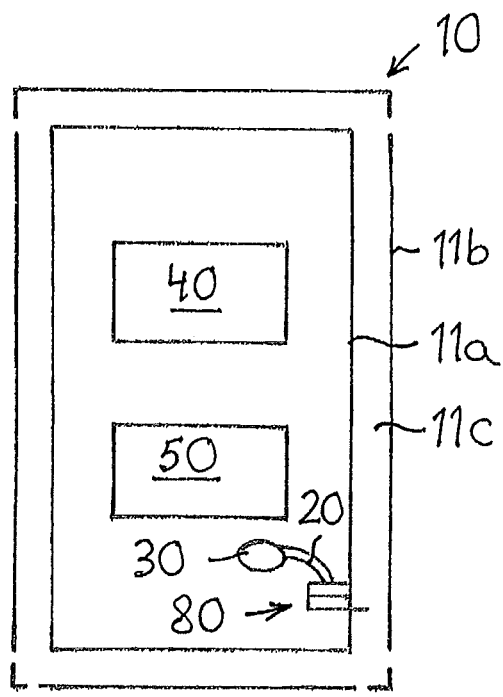
FIG. 12 shows a first implementation of the arrangement of FIG. 11 in an equipment space according to an exemplary embodiment of the disclosure.

FIG. 12 shows a first implementation of the arrangement of FIG. 11 in an equipment space according to an exemplary embodiment of the disclosure. FIG. 12 shows a first possibility to use the embodiment of FIG. 11 in an equipment space. The equipment space 10 includes electrical equipment 40, 50 for example, electric motor control apparatuses like frequency converters etc. and an air dryer 30 condensing the moisture in the air of the equipment space 10 into water. The water condensed by the air dryer 30 is lead with a hose or pipe 20 to a water container 80 situated inside the equipment space 10. The water container 80 corresponds to that shown in FIG. 11. The water entering into the water container 80 can flow along the capillary structure in the porous element 60 at the bottom 81 of the water container 80 to the drop nose e.g., the outer portion of the bottom 81 of the water container 80. The drop nose is situated in the space 11c between the inner side wall 11a and the outer side wall 11b of the equipment space 10. The water will either drop down from the drop nose or the water can be evaporated with the heating element 90 into the ventilation air flow in the space 11c between the inner shell 11a and the outer shell 11b of the equipment space 10.

Figure 13:
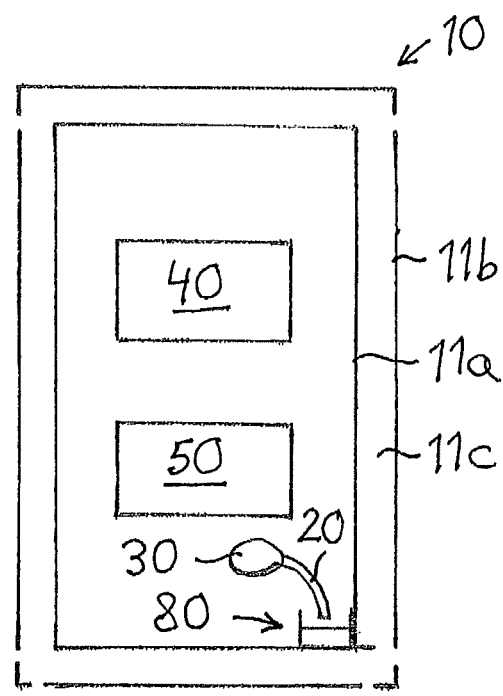
FIG. 13 shows a second implementation of the arrangement of FIG. 11 in an equipment space according to an exemplary embodiment of the disclosure.

FIG. 13 shows a second implementation of the arrangement of FIG. 11 in an equipment space according to an exemplary embodiment of the disclosure. FIG. 13 shows a second possibility to use the embodiment of FIG. 11 in an equipment space. The arrangement corresponds to that shown in FIG. 12 except for the position of the water container 80. As shown in FIG. 13, the water container 80 is positioned at the floor of the inner shell 11a of the equipment space 10. The situation could be such that instead of a water container 80 only the porous element 60 has been put on the floor of the inner shell 11a of the equipment space 10. Such a solution could be applied in a situation where there is only a modest amount of humidity in the air in the equipment space 10. It would then be possible to lead the water condensed by the air dryer 30 through the capillary structure of the porous element 60 out of the interior of the equipment space 10 without the water level rising too much at the floor of the inner shell 11a.

The material of the porous element 60 should advantageously be bacteriostatic, e.g., the material should resist the growth of moulds and sponges. The material of the porous element 60 should further withstand climatic circumstances and wearing caused by for example, ants, and termites. The porous element 60 can be made of one material or of several materials. A porous element 60 including only one material can be made of metal or ceramic granulates that have been sintered in order to achieve a solid porous material. The sintering process makes attachments between the granulates, but there still remains fluid passages between the granulates after the sintering process. This means that the sintering process results in a solid porous material having a capillary structure. The porous element 60 can also be made of metal foams containing a large fraction of gas filled pores. Metal foams have a high porosity and a capillary structure in the metal foam. The porous element 60 can be made bacteriostatic by using materials such as copper or its alloys or cobalt or nickel. If the porous element is made of a material, which is not as such bacteriostatic, then the pipe 20 leading water to the porous element 60 can be made of a bacteriostatic material for example, copper. If neither the pipe 20 nor the porous element 60 is bacteriostatic, then one can insert for example, a copper piece in the pipe 20 in order to turn the water into bacteriostatic.

The porous element 60 can in those embodiments where the porous element 60 is made of two or several materials include a first material being made of sintered metal or ceramic or metal foams. The first material would thus form a solid porous layer with a capillary structure. The first material could also in some embodiments be a solid material of for example, metal, or ceramic. The first material can thus form a support structure if needed. The second material in the porous element 60 can be granulates in loose format. The granulates in the second material can be of metal or ceramic or sand or some other suitable material. The granulates in the second material are thus free to move in relation to each other and need to be surrounded by some support structure.

The exemplary embodiments in the figures of the present disclosure show an equipment space 10 including an inner shell 11*a*, an outer shell 11*b* and a space 11*c* between the shells. This is an exemplary embodiment, but there could instead of a separate inner and outer shell be only one shell in the equipment space 10. The porous member would then be situated in an outlet opening of the single shell of the equipment space 10.

The equipment space 10 can be provided with a door allowing access into the interior of the equipment space 10. Access into the equipment space 10 can be provided for example, in order to be able to service the equipment 40, 50 situated in the equipment space 10.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A system for removing water from an equipment space configured as a closed space having electrical equipment and an air dryer to condense the moisture of air in the equipment space into water, the system comprising:
    a porous element having a capillary structure and being located in an outlet opening of said equipment space,
    a loose porous material layer made of granulates in loose format being abutted on a first inner surface of the porous element,
    wherein the porous element is connected to receive water from the air dryer through the loose porous material layer to the first inner surface of the porous element, said capillary structure of the porous element is configured to propogate water from the inner surface to an outer surface, and the outer surface is configured to release the water to ambient air outside the equipment space.

2. The system according to claim 1, wherein the porous element is positioned in an outlet opening of a water directing means, the water directing means including a hose or pipe connected to lead water from the air dryer to the inner surface of the porous element.

3. The system according to claim 1, wherein the porous element is positioned in an outlet opening in a wall of the equipment space, whereby a water directing means is connected to direct the water from the air dryer to the inner surface of the porous element.

4. The system according to of claim 1, wherein the porous element is made of metal or ceramic granulates that have been sintered to achieve a solid porous material or of metal foams, which forms a capillary structure.

5. The system according to claim 1, wherein the equipment space has a shell including a closed inner shell, an outer shell, and a ventilated space between the inner shell and the outer shell, whereby at least the second outer surface of the porous element is located in the ventilated space between the inner shell and the outer shell of the equipment space.

6. A method for removing water from an equipment space configured as a closed space having electrical equipment, an air dryer to condense the moisture of air in the equipment space into water, and a porous element having a capillary structure and being located in an outlet opening of said equipment space, and a loose porous material layer made of granulates in loose format abutted on a first inner surface of the porous element, the method comprising:
    directing water condensed by the air dryer through the loose porous material layer to the first inner surface of the porous element;
    propagating said water in the capillary structure of the porous element from the inner surface of the porous element to an outer surface of the porous element; and
    releasing water from the outer surface of the porous element to ambient air outside the equipment space.

7. An arrangement for removing water from an equipment space, said equipment space being a closed space provided with electrical equipment and an air dryer condensing the moisture of the air in the equipment space into water, the arrangement comprising:
    a porous element having a capillary structure and being located in an outlet opening of said equipment space,
    a loose porous material layer made of granulates in loose format being abutted on a first inner surface of the porous element,
    whereby water condensed by the air dryer is directed through the loose porous material layer to the first inner surface of the porous element, said water propagating in the capillary structure of the porous element from the first inner surface of the porous element to a second outer surface of the porous element from which second outer surface of the porous element the water is released to ambient air outside the equipment space.

8. The arrangement according to claim 7, wherein the porous element is positioned in an outlet opening in a water directing means being formed of a hose or pipe leading water from the air dryer to the first inner surface of the porous element.

9. The arrangement according to claim 7, wherein the porous element is positioned in an outlet opening in a wall of the equipment space, whereby a water directing means directs the water from the air dryer to the first inner surface of the porous element.

10. The arrangement according to of claim 7, wherein the porous element is made of metal or ceramic granulates that have been sintered to achieve a solid porous material or of metal foams, which forms a capillary structure.

11. The arrangement according to claim 7, wherein the porous element includes an outer material layer made of metal or ceramic granulates that have been sintered or of metal foams, said outer material layer forming a support structure of the porous element and an inner material layer forming the loose porous material layer.

12. The arrangement according to claim 7, wherein the arrangement is bacteriostatic by the porous element or a part thereof of copper or its alloys or cobalt or nickel.

13. The arrangement according to claim 7, wherein the equipment space has a shell including a closed inner shell, an outer shell and a ventilated space between the inner shell and the outer shell, whereby at least the second outer surface of the porous element is situated in the ventilated space between the inner shell and the outer shell of the equipment space.

* * * * *